(12) United States Patent
Wan et al.

(10) Patent No.: US 12,366,781 B2
(45) Date of Patent: Jul. 22, 2025

(54) ARRAY SUBSTRATE AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Yunhai Wan, Beijing (CN); Zhixiang Zou, Beijing (CN); Chuan Chen, Beijing (CN); Xuehai Gui, Beijing (CN); Peihua Sun, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 303 days.

(21) Appl. No.: 17/913,465

(22) PCT Filed: Aug. 11, 2021

(86) PCT No.: PCT/CN2021/111923
§ 371 (c)(1),
(2) Date: Sep. 22, 2022

(87) PCT Pub. No.: WO2022/052722
PCT Pub. Date: Mar. 17, 2022

(65) Prior Publication Data
US 2023/0134406 A1 May 4, 2023

(30) Foreign Application Priority Data

Sep. 11, 2020 (CN) .......................... 202010955164.5

(51) Int. Cl.
*G02F 1/1362* (2006.01)
*G02F 1/1343* (2006.01)
(Continued)

(52) U.S. Cl.
CPC .. *G02F 1/136286* (2013.01); *G02F 1/134345* (2021.01); *G02F 1/134372* (2021.01);
(Continued)

(58) Field of Classification Search
CPC ............ G02F 1/1343; G02F 1/136286; G02F 1/1368; G02F 1/134372; G02F 1/136227
See application file for complete search history.

(56) References Cited

U.S. PATENT DOCUMENTS 10,234,737 B2  3/2019  Cheng et al.
10,394,355 B2  8/2019  Kim et al.
(Continued)

FOREIGN PATENT DOCUMENTS

CN   101556417 A   10/2009
CN   101995700 A    3/2011
(Continued)

OTHER PUBLICATIONS

International Search Report and Written Opinion mailed on Nov. 16, 2021, in corresponding PCT/CN2021/111923, 10 pages.
(Continued)

*Primary Examiner* — Jia X Pan
(74) *Attorney, Agent, or Firm* — XSENSUS LLP

(57) ABSTRACT

An array substrate includes sub-pixels arranged in an array, scan lines, and data lines on a base substrate, with any one of the sub-pixels including a pixel electrode and a switch transistor; wherein the pixel electrode is connected to a drain electrode of the switch transistor, a gate electrode of the switch transistor is connected to one of the scan lines, a source electrode of the switch transistor is connected to one of the data lines; and an active layer of the switch transistor of the sub-pixel is located between the pixel electrode of the sub-pixel and the data line connected to the sub-pixel.

18 Claims, 9 Drawing Sheets

(51) Int. Cl.
 *G02F 1/1368* (2006.01)
 *H10D 86/40* (2025.01)
 *H10D 86/60* (2025.01)

(52) U.S. Cl.
 CPC ...... *G02F 1/1362* (2013.01); *G02F 1/136227* (2013.01); *G02F 1/1368* (2013.01); *H10D 86/441* (2025.01); *H10D 86/60* (2025.01); *G02F 2202/16* (2013.01)

(56) References Cited

U.S. PATENT DOCUMENTS

| | | | |
|---|---|---|---|
| 10,598,995 | B2 | 3/2020 | Hao |
| 10,613,664 | B2 | 4/2020 | Kim et al. |
| 10,825,840 | B2 | 11/2020 | Na et al. |
| 2006/0001813 | A1* | 1/2006 | Ham .................. G02F 1/134363 349/141 |
| 2010/0207846 | A1 | 8/2010 | Na et al. |
| 2010/0315584 | A1* | 12/2010 | Cho .................. G02F 1/134363 349/141 |
| 2011/0249218 | A1* | 10/2011 | Kim .................. G02F 1/136209 438/34 |
| 2016/0147119 | A1* | 5/2016 | Chang .................. G09G 3/3648 349/33 |
| 2016/0190167 | A1 | 6/2016 | Na et al. |
| 2017/0045791 | A1 | 2/2017 | Cheng et al. |
| 2017/0153511 | A1* | 6/2017 | Um .................. G02F 1/136286 |
| 2017/0177159 | A1* | 6/2017 | Cao ...................... G06F 3/0412 |
| 2017/0192571 | A1 | 7/2017 | Kim et al. |
| 2017/0227803 | A1* | 8/2017 | Chen .................. H01L 27/1259 |
| 2017/0261821 | A1* | 9/2017 | Lee .................. G02F 1/136286 |
| 2017/0269444 | A1* | 9/2017 | Hao .................. G02F 1/136204 |
| 2018/0374874 | A1* | 12/2018 | Cao ...................... H01L 23/3171 |
| 2019/0129258 | A1* | 5/2019 | Liu ...................... G06F 3/0412 |
| 2019/0332215 | A1 | 10/2019 | Kim et al. |
| 2020/0089066 | A1 | 3/2020 | Li |
| 2023/0384639 | A1* | 11/2023 | Kimura .............. G02F 1/13439 |

FOREIGN PATENT DOCUMENTS

| | | | |
|---|---|---|---|
| CN | 203337963 U | 12/2013 | |
| CN | 104122694 A | 10/2014 | |
| CN | 104637958 A | 5/2015 | |
| CN | 105093762 A | 11/2015 | |
| CN | 106980422 A | 7/2017 | |
| CN | 108490705 * | 9/2018 | .......... G02F 1/1343 |
| CN | 108490705 A | 9/2018 | |
| CN | 110262146 A | 9/2019 | |
| CN | 110308600 A | 10/2019 | |
| CN | 112034656 A | 12/2020 | |
| EP | 3358401 A1 | 8/2018 | |
| JP | 2000-323715 A | 11/2000 | |
| KR | 2007-0028142 A | 3/2007 | |
| KR | 2010-0094220 A | 8/2010 | |
| KR | 2011-0076016 A | 7/2011 | |

OTHER PUBLICATIONS

Office Action issued on Dec. 30, 2021, in corresponding Chinese patent Application No. 202010955164.5, 17 pages.
Notice of Allowance issued on May 26, 2022, in corresponding Chinese patent Application No. 202010955164.5, with English Supplementary search, 6 pages.

* cited by examiner

US 12,366,781 B2

ARRAY SUBSTRATE AND DISPLAY APPARATUS

CROSS-REFERENCE TO RELATED APPLICATIONS

The present application is the U.S. national phase application of PCT Application No. PCT/CN2021/111923, filed Aug. 11, 2021, which claims priority to a Chinese patent application No. 202010955164.5, filed Sep. 11, 2020 and entitled "Array Substrate and Display Apparatus", the entire contents of which are incorporated herein by reference in their entirety.

TECHNICAL FIELD

The present disclosure relates to the field of display technology, and in particular, to an array substrate and a display apparatus.

BACKGROUND

The liquid crystal display panel may include an array substrate and a color filter substrate arranged to form a cell. In the related art, referring to FIG. 1, the array substrate may include sub-pixels arranged in an array, and scan lines 350 and data lines 360, where any sub-pixel includes a pixel electrode 310 and a switch transistor 320, and the switch transistor is provided with a drain electrode 330. The pixel electrode 310 is connected to the drain electrode 330 of the switch transistor, the data line 360 is connected to the source electrode of the switch transistor, the scan line 350 is connected to the gate electrode of the switch transistor 320, and the connection lines of the source electrode and the drain electrode of the switch transistor are parallel to an extending direction of the scan line 350.

Referring to FIG. 1, for any sub-pixel, the drain electrode 330 is provided between the pixel electrode 310 and the scan line 350 connected to the sub-pixel, which results in a large avoidance space A between the pixel electrode 310 and the scan line 350, thereby reducing a size of the pixel electrode 310 in the column direction C. The avoidance space A includes not only a space occupied by the drain electrode 330, but also part of a space adjacent to the drain electrode 330 in the row direction B, which makes the size of the avoidance space A much larger than that of the space occupied by the drain electrode 330. The presence of the avoidance space A restricts the area of the pixel electrode 310, reduces the aperture ratio of the liquid crystal display panel, and is not conducive to improving the light transmittance of the liquid crystal display panel.

The above information disclosed in this section is only for understanding the background of the disclosure and therefore may contain information not belonging to the prior art that is already known to those skilled in the art.

SUMMARY

The present disclosure is directed to provide an array substrate and a display apparatus to improve the light transmittance of the display panel.

To achieve the above-mentioned purpose of the disclosure, the following technical solutions are proposed.

According to a first aspect of the disclosure, an array substrate is provided, including sub-pixels arranged in an array, scan lines, and data lines on a base substrate, with any one of the sub-pixels including a pixel electrode and a switch transistor; where the pixel electrode is connected to a drain electrode of the switch transistor, a gate electrode of the switch transistor is connected to one of the scan lines, and a source electrode of the switch transistor is connected to one of the data lines; and an active layer of the switch transistor of the sub-pixel is located between the pixel electrode of the sub-pixel and the data line connected to the sub-pixel.

In some embodiments of the disclosure, the data line includes first conductive leads and second conductive leads that are alternatively connected;

the second conductive lead extends along a direction intersecting the scan line, and the first conductive lead is bent into a curve or a bend line from an extending direction of the second conductive lead adjacent to the first conductive lead to a direction away from the pixel electrode of the sub-pixel connected to the data line;

a first end of the first conductive lead is connected to a first end of the second conductive lead, and a second end of the first conductive lead is connected to a second end of a second conductive lead in a next row; an avoidance area is formed between the first conductive lead and the pixel electrode of the sub-pixel adjacent to and electrically connected to the first conductive lead, and an extension line of the second end of the second conductive lead and the active layer are located in the avoidance area.

In some embodiments of the disclosure, a preset included angle is formed between the channel direction of the active layer and an extending direction of the scan line.

In some embodiments of the disclosure, a channel direction of the active layer is perpendicular to the extending direction of the scan line.

In some embodiments of the disclosure, the pixel electrode in the sub-pixel includes strip sub-electrodes, and included angles between the strip sub-electrodes and the scan line are not 90 degrees; and in a same sub-pixel, the channel direction of the active layer is consistent with an extending direction of the strip sub-electrodes of the pixel electrode.

In some embodiments of the disclosure, a channel direction of the active layer is consistent with an extending direction of the scan line.

In some embodiments of the disclosure, the second conductive lead is a metal lead; and the first conductive lead is a metal lead or a transparent metal oxide lead.

In some embodiments of the disclosure, the second conductive lead and the drain electrode of the switch transistor are provided in a same layer and made of a same material; and the first conductive lead and one of the pixel electrode, a common electrode of the array substrate, a common electrode line of the array substrate, the drain electrode of the switch transistor, and the scan line are arranged in a same layer and made of a same material.

In some embodiments of the disclosure, the pixel electrode in the sub-pixel includes strip sub-electrodes arranged in parallel;

the first conductive lead is formed in a bend line, and includes a connecting lead segment and a first strip lead segment connected in sequence; the connecting lead segment is connected to the second conductive lead and is parallel to the scan line, and the first strip lead segment extends along a same direction as the strip sub-electrode of the pixel electrode and is electrically connected to the second conductive lead in the next row.

In some embodiments of the disclosure, the pixel electrode is provided with a protruding portion, and the protruding portion of the pixel electrode is located on an extension line of the first strip lead segment arranged adjacent to the pixel electrode;

an extending direction of the first strip lead segment is parallel to an extending direction of the strip sub-electrode of the pixel electrode arranged adjacent to the first strip lead segment; and the first conductive lead and the pixel electrode are arranged in a same layer and made of a same material.

In some embodiments of the disclosure, the pixel electrode in the sub-pixel includes strip sub-electrodes;

the second conductive lead includes a second strip lead segment, and an extending direction of the second strip lead segment is parallel to an extending direction of the strip sub-electrode of the pixel electrode arranged adjacent to the second strip lead segment.

According to a second aspect of the disclosure, a display apparatus is provided, including the array substrate as described above.

According to the array substrate and display apparatus according to some embodiments of the present disclosure, the drain electrode of the sub-pixel is arranged between the pixel electrode and the data line, so that the drain electrode is avoided to be arranged between the pixel electrode and the scan line, thereby increasing the area of the pixel electrode by utilizing the avoidance area in the related art, which is beneficial to improve the light transmittance of the display panel using the array substrate.

BRIEF DESCRIPTION OF THE DRAWINGS

The above and other features and advantages of the present disclosure will become more apparent from the detailed description of embodiments thereof with reference to the accompanying drawings.

Figure 1:
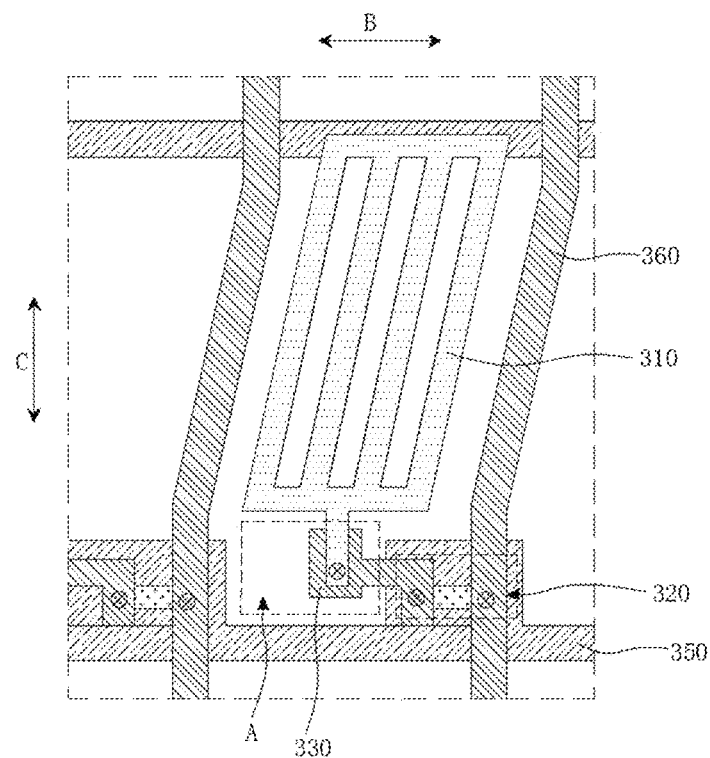
FIG. 1 is a schematic top view of an array substrate in the related art.

Main elements in the drawings are described as follows.

1. array substrate; 110, base substrate; 120, semiconductor layer; 130, gate layer; 140, source-drain metal layer; 150, pixel electrode layer; 160, common electrode layer; 161, avoidance opening; 170, alignment layer; 210, gate insulating layer; 220, interlayer dielectric layer; 230, planarization layer; 240, insulating dielectric layer; 310, pixel electrode; 311, strip sub-electrode; 312, hollow slit; 313, avoidance notch; 314, protruding portion; 320, switch transistor; 3201, active layer of switch transistor; 321, source contact region of the switch transistor; 322, drain contact region of the switch transistor; 323, channel region of the switch transistor; 3202, gate electrode of the switch transistor; 330, drain electrode; 340, common electrode; 350, scan line; 360, data line; 361, first conductive lead; 3611, first strip lead segment; 3612, connecting lead segment; 362, second conductive lead; 3621, second strip lead segment; 363, via hole; 2, color filter substrate; 21, black matrix layer; 3, liquid crystal layer; A, avoidance space; B, row direction; C, column direction; D, avoidance area.

DETAILED DESCRIPTION

Exemplary embodiments will now be described more fully with reference to the accompanying drawings. These exemplary embodiments, however, can be embodied in various forms and should not be construed as limited to the examples set forth herein. Instead, these embodiments are provided so that this disclosure will be thorough and complete, and will fully convey the concept of exemplary embodiments to those skilled in the art. The described features, structures, or characteristics may be combined in any suitable manner in one or more embodiments. In the following description, numerous specific details are provided in order to give a thorough understanding of the embodiments of the present disclosure.

In the drawings, the thickness of regions and layers may be exaggerated for clarity. The same reference numerals in the drawings denote the same or similar structures, and thus their detailed descriptions will be omitted.

The described features, structures, or characteristics may be combined in any suitable manner in one or more embodiments. In the following description, numerous specific details are provided in order to give a thorough understanding of the embodiments of the present disclosure. However, it should be understood by those skilled in the art that the technical solutions of the present disclosure may be practiced without one or more of the specific details, or other methods, components materials, and the like may be adopted. In other instances, well-known structures, materials, or operations are not shown or described in detail to avoid obscuring the main technical concept of the present disclosure.

Throughout the disclosure, when referring to a structure "connected" with other structures, it means that the structure may be integral with other structures, or the structure may be "directly" connected to other structures, or the structure may be "indirectly" connected to other structures through another structure. When referring to a structure "electrically connected" to another structure, it means that the structure may be "directly" electrically connected to another structure, or the structure may be "indirectly" connected to another structure through other structures that can conduct electrical connection. The terms "a" and "an" are used to indicate the presence of an element/component/and the like; the terms "include" and "have" are used to indicate an open-ended inclusive meaning and mean that there may be additional elements/components/and the like in addition to the elements/components/and the like as listed. The terms "first", "second" and the like are used only as labels and are not intended to limit the number of their objects.

Throughout the disclosure, when referring to "arranged in the same layer", it means that related structures may be made from the same material layer through a patterning process, so they are in the same layer as in a lamination relationship, but it does not mean that these structures must be in the same distance from the base substrate.

The present disclosure provides an array substrate, which may be applied to a liquid crystal display panel. Referring to FIG. 2 to FIG. 15, the array substrate includes a plurality of scan lines 350, a plurality of data lines 360, and a plurality of sub-pixels arranged in an array that are provided on a base substrate 110, and any sub-pixel includes a pixel electrode 310 and a switch transistor 320. Herein, the pixel electrode 310 is connected with the drain electrode 330 of the switch transistor 320, the gate electrode 3202 of the switch transistor 320 is connected with a scan line 350, the source electrode of the switch transistor 320 is connected with a data line 360; and the active layer 3201 of the switch transistor 320 in the sub-pixel is located between the pixel electrode 310 of the sub-pixel and the data line 360 connected to the sub-pixel.

In the array substrate according to some embodiments of the present disclosure, the active layer 3201 of the switch transistor 320 of the sub-pixel is provided between the pixel electrode 310 and the data line 360, so as to avoid providing the switch transistor 320 between the pixel electrode 310 and the scan line 350, thereby increasing the area of the pixel electrode 310 by utilizing the avoidance space A in the related art, which is beneficial to improve the light transmittance of the display panel to which the array substrate is applied.

Hereinafter, the structure, principle and effect of the array substrate of the present disclosure will be further explained and described with reference to the accompanying drawings.

In the array substrate according to some embodiments of the present disclosure, the orthographic projection of the active layer 3201 of the switch transistor 320 of the sub-pixel on the base substrate 110 is located between the orthographic projection of the pixel electrode 310 of the sub-pixel on the base substrate 110 and the orthographic projection of the data line 360 electrically connected with the sub-pixel on the base substrate 110.

Figure 2:
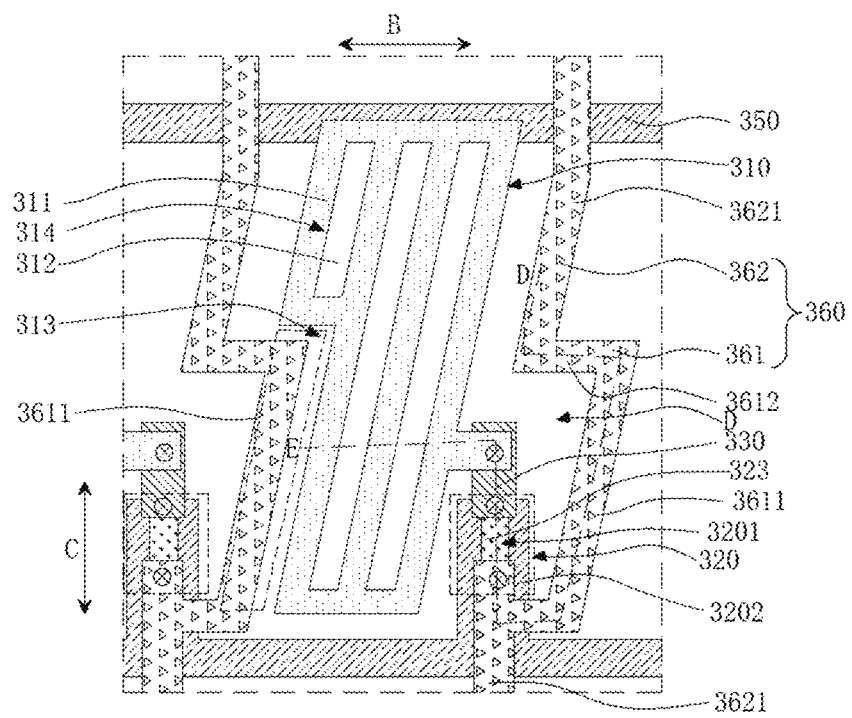
FIG. 2 is a schematic top-view structural diagram of an array substrate according to some embodiments of the present disclosure.

Referring to FIG. 2, in the array substrate according to some embodiments of the present disclosure, when viewed from a direction perpendicular to the base substrate 110, the drain electrode 330 of any sub-pixel is located between the pixel electrode 310 of the sub-pixel and the data line 360 connected to the sub-pixel, rather than being provided between the pixel electrode 310 of the sub-pixel and the scan line 350 connected to the sub-pixel. Accordingly, there is no need to provide the avoidance space A, as in the related art, between the pixel electrode 310 of the sub-pixel and the scan line 350 connected to the sub-pixel. The area of the pixel electrode 310 of the sub-pixel can be increased by covering the avoidance space A in the related art.

Further, referring to FIG. 2, when viewed from the direction perpendicular to the base substrate 110, the drain electrode 330 and the active layer 3201 occupy part of the space originally used for arranging the data lines 360, so that the data lines 360 need to be bent to avoid the drain electrode 330 and active layer 3201. Therefore, this causes the pixel electrode 310 to be provided with an avoidance notch 313. Since the size of the avoidance space A in the related art is much larger than the size of the drain electrode 330 and the active layer 3201, the increased area of the pixel electrode 310 of the present disclosure brought about by occupying the avoidance space A is larger than the area lost due to the avoidance notch 313, so that the area of the pixel electrode 310 is increased compared with the related art.

Exemplarily, referring to FIG. 2, in the array substrate according to some embodiments of the present disclosure, the pixel electrode 310 is provided with an avoidance notch 313. In the same sub-pixel, the avoidance notch 313 is located on the side of the pixel electrode 310 away from the drain electrode 330 and the active layer 3201, and is located on the side of the pixel electrode 310 close to the scan line 350 connected to the sub-pixel. The orthographic projection of the first conductive lead 361 adjacent to the sub-pixel and away from the drain electrode 330 of the sub-pixel on the base substrate 110, is at least partially located in the orthographic projection of the avoidance notch 313 of the sub-pixel on the base substrate 110. In other words, the pixel electrode 310 is provided with a protruding portion 314, and the protruding portion 314 of the pixel electrode 310 is located on a side of the pixel electrode 310 away from the scan line 350 electrically connected thereto, and on a side of the pixel electrode 310 away from the data line 360 electrically connected thereto. The array substrate according to some embodiments of the present disclosure may include a base substrate 110, a driving circuit layer and a pixel electrode layer 150 stacked in sequence, where the driving circuit layer includes the switch transistor 320 and the scan line 350 of the array substrate; and the pixel electrode layer 150 includes the pixel electrode 310. It can be understood that the pixel electrode 310 is a transparent electrode. The switch transistor 320 may be a metal-oxide-semiconductor field effect transistor (MOS-FET). In some embodiments, the switch transistor 320 is a thin film transistor. As to the film layer structure, the switch transistor 320 may be a top-gate switch transistor 320 or a bottom-gate switch transistor 320, which is not limited in the present disclosure. As to the material of the semiconductor layer 120 of the switch transistor 320, the switch transistor 320 may be an amorphous silicon switch thin film transistor, a low temperature polysilicon thin film transistor, an oxide thin film transistor or an organic semiconductor thin film transistor, which is not limited in the present disclosure. As to the turn-on condition of the switch transistor 320, the switch transistor 320 may be an N-type switch transistor 320 or a P-type switch transistor 320, which is not limited in the present disclosure.

Optionally, referring to FIG. 4, FIG. 9, FIG. 11 and FIG. 13, the driving circuit layer may include a gate layer 130, a gate insulating layer 210, a semiconductor layer 120, an interlayer dielectric layer 220, a source-drain metal layer 140, a planarization layer 230 and other film layers that are stacked together. The positional relationship of each film layer may be determined according to the film layer structure of the switch transistor 320. For example, in some embodiments of the present disclosure, the driving circuit layer may include a semiconductor layer 120, a gate insulating layer 210, a gate layer 130, an interlayer dielectric layer 220, and a source-drain metal layer 140, which are sequentially stacked. The switch transistor 320 thus formed is a top-gate thin film transistor. For another example, in some other embodiments of the present disclosure, the driving circuit layer may include a gate layer 130, a gate insulating layer 210, an active layer, an interlayer dielectric layer 220 and a source-drain metal layer 140 that are stacked in sequence, and the switch transistor 320 thus formed is a bottom-gate thin film transistor.

In some embodiments, the drain electrode 330 is located on the source-drain metal layer 140 of the array substrate.

In some embodiments, the scan lines 350 are located on the gate layer 130 of the array substrate.

In some embodiments, the switch transistor 320 is a bottom gate metal oxide thin film transistor.

In some embodiments, referring to FIG. 4, FIG. 9, FIG. 11 and FIG. 13, the array substrate may further include a common electrode layer 160, the common electrode layer 160 may include common electrodes 340 of each sub-pixel, and the common electrodes 340 may be interdigital electrodes, plate electrodes, slit electrodes or electrodes of other shapes. The common electrode layer 160 may be disposed between the pixel electrode layer 150 and the driving circuit layer, or may be disposed on the side of the pixel electrode layer 150 away from the driving circuit layer. In some embodiments of the present disclosure, referring to FIG. 4, FIG. 9, FIG. 11 and FIG. 13, the common electrode layer 160 is provided between the pixel electrode layer 150 and the driving circuit layer, a planarization layer 230 is disposed between the common electrode layer 160 and the source-drain metal layer 140 of the driving circuit layer, and an insulating medium layer 240 is disposed between the common electrode layer 160 and the pixel electrode layer 150. In some other embodiments of the present disclosure, referring to FIG. 4, FIG. 9, FIG. 11 and FIG. 13, in the common electrode layer 160, the common electrodes 340 are plate electrodes. In other words, the common electrode 340 is not provided with any hollow structure, for example, is not provided with any slit or the like. In some other embodiments of the present disclosure, the common electrode layer 160 further includes common electrode lines, and adjacent common electrodes 340 may be connected to each other through a common electrode line.

Optionally, both the common electrode 340 and the pixel electrode 310 are transparent electrodes, and the material thereof may be transparent metal oxide.

Optionally, any one of the data lines 360 may include a first conductive lead 361 and a second conductive lead 362 that are alternately arranged and electrically connected in sequence. FIG. 2 is a top view of an array substrate according to some embodiments of the present disclosure. In FIG. 2, only the pixel electrode 310, the switch transistor 320, the drain electrode 330, the scan line 350 and the data line 360 are shown. In FIG. 2, the data line 360 is only shown with the position of its orthographic projection on the base substrate 110, without its structure on the film layer. That is, in FIG. 2, the data line 360 may include the first conductive lead 361 and the second conductive lead 362 provided on the same layer, or may include the first conductive lead 361 and second conductive lead 362 provided on two different film layers and connected through the via hole 363.

Optionally, the array substrate includes multiple rows of sub-pixels; any one of the data lines 360 includes a conductive lead group corresponding to each row of sub-pixels, where one conductive lead group includes a first conductive lead 361 and a second conductive lead 361 connected adjacently. In this way, each sub-pixel is provided in a one-to-one correspondence with each conductive lead group, and one sub-pixel is provided adjacent to a corresponding conductive lead group and is directly or indirectly electrically connected thereto. In other words, one sub-pixel is provided adjacent to the corresponding conductive lead group, and is electrically connected to the data line 360 where the corresponding conductive lead group is located. Further, the first end of the first conductive lead 361 is electrically connected to the first end of the second conductive lead 362, the second end of the first conductive lead 361 is electrically connected to the second end of the second conductive lead 362 in the next row, and the second end of the second conductive lead 362 is electrically connected to the second end of the first conductive lead 361. In some embodiments of the present disclosure, the source electrode of the switch transistor of one sub-pixel is electrically connected to the second conductive lead 362 in the next row of the corresponding conductive lead group.

In some embodiments of the present disclosure, referring to FIG. 2, the second conductive lead 362 extends along a direction intersecting the scan line 350, and the first conductive lead 361 is bent into a curve or a bend line from an extending direction of the second conductive lead 362 adjacent thereto to a direction away from the pixel electrode 310 of the sub-pixel connected to the data line 360. The first end of the first conductive lead 361 is connected to the first end of the second conductive lead 362, and the second end of the first conductive lead 361 is connected to the second end of the second conductive lead 362 in the next row. An avoidance area D is formed between the first conductive lead 361 and the pixel electrode 310 of the sub-pixel that is adjacent and electrically connected thereto, and the extension line of the second end of the second conductive lead 362 and the active layer 3201 are located in the avoidance area D. In some embodiments, the second conductive lead 362 is a metal lead; and the first conductive lead 361 is a metal lead or a transparent metal oxide lead. In some other embodiments, the material of the first conductive lead 361 may also be a heavily doped semiconductor material. Further, in some embodiments, the second conductive lead 362 and the drain electrode 330 of the switch transistor 320 are provided in the same layer and made of the same material; and the first conductive lead 361 and one of the pixel electrode 310, the common electrode of the array substrate, and the common electrode line of the array substrate, the drain electrode 330 of the switch transistor 310, and the scan line 350 are provided in the same layer and made of the same material.

Optionally, referring to FIG. 4, FIG. 9, FIG. 11 and FIG. 13, the second conductive lead 362 is located in the source-drain metal layer 140, that is, the second conductive lead 362 and the drain electrode 330 are arranged in the same layer and made of the same material, and the second conductive lead 362 is a metal lead. Further, referring to FIG. 3, FIG. 5, FIG. 6, FIG. 8, FIG. 10, FIG. 12, and FIG. 14, the orthographic projection of the second conductive lead 362 on the base substrate 110 overlaps with the orthographic projection of the scan line 350 on the base substrate 110. In other words, the data line 360 may include a plurality of first conductive leads 361 and second conductive leads 362 that are alternately connected in sequence; where the orthographic projection of the first conductive leads 361 on the base substrate 110 does not overlap with the orthographic projection of the scan line 350 on the base substrate 110, and the orthographic projection of the second conductive lead 362 on the base substrate 110 overlaps with the orthographic projection of the scan line 350 on the base substrate 110.

Optionally, referring to FIG. 3, FIG. 5, FIG. 6, FIG. 8, FIG. 10, FIG. 12, and FIG. 14, the pixel electrode 310 includes multiple strip sub-electrodes 311 arranged in parallel; the second conductive lead 362 provided adjacent to the pixel electrode 310 includes a second strip lead segment 3621, and an extending direction of the second strip lead segment 3621 is parallel to the extending direction of the strip sub-electrode 311 of the adjacent pixel electrode 310. In this way, the shape of the pixel electrode 310 and the extension direction of the data line 360 can be matched with each other, thereby reducing the area of the pixel electrode 310 that may be lost due to the arrangement of the data line 360, and increasing the area of the pixel electrode 310.

The extending direction of the strip sub-electrode 311 intersects with the extending direction of the scan line 350, for example, the included angle therebetween may be 75° to 90°. The extending directions of the strip sub-electrodes 311 of the sub-pixels in two adjacent rows may be the same or different. For example, in some embodiments of the present disclosure, the pixel electrode 310 in the sub-pixel includes multiple strip sub-electrodes 311, and the included angle between the strip sub-electrodes 311 and the scan line is not 90 degrees. Exemplarily, the extending directions of the strip sub-electrodes 311 of the sub-pixels in two adjacent rows are the same, and intersect with the extending direction of the scan lines 350 at an acute angle of 75° to 85°. For another example, in some other embodiments of the present disclosure, the extending direction of the strip sub-electrodes 311 of each sub-pixel is perpendicular to the extending direction of the scan lines 350. For another example, in some other embodiments of the present disclosure, the extending directions of the strip sub-electrodes 311 of the sub-pixels in two adjacent rows are symmetrical with respect to the extending direction of the scan line 350, and both of them intersect with the extending direction of the scan line 350 at an acute angle of 75° to 85°.

Optionally, the first conductive lead 361 is a bend line, including a connecting lead segment 3612 and a first strip lead segment 3611 connected in sequence; the connecting lead segment 3612 is connected to the second conductive lead 362 and is parallel to the scan line 350, the first strip lead segment 3611 extends along the same direction as the strip sub-electrode 311 of the pixel electrode and is electrically connected to the second conductive lead 362 in the next row.

Optionally, the first conductive lead 361 and the second conductive lead 362 may be provided on the same layer, or may be provided on different layers. Correspondingly, the data line 360 may be provided only on the driving circuit layer, or may be provided partially on the driving circuit layer and partially on the pixel electrode layer 150, or may be provided partially on the driving circuit layer and partially on the common electrode layer 160. In some embodiments of the present disclosure, referring to FIG. 3 and FIG. 4, the data line 360 includes a first conductive lead 361 and a second conductive lead 362 that are alternately connected; the first conductive lead 361 and the pixel electrode 310 are provided in the same layer and made of the same material; the second conductive lead 362 and the drain electrode 330 of the switch transistor are provided in the same layer and made of the same material; and the first conductive lead 361 and the second conductive lead 362 are electrically connected through the via hole 363. In other words, the array substrate includes the source-drain metal layer 140 and the pixel electrode layer 150 sequentially stacked on one side of the base substrate 110, where the source-drain metal layer 140 includes the second conductive lead 362 and the drain electrode 330, the pixel electrode layer 150 includes the pixel electrode 310 and the first conductive lead 361, and the first conductive lead 361 and the second conductive lead 362 are electrically connected through the via hole 363.

Figure 3:
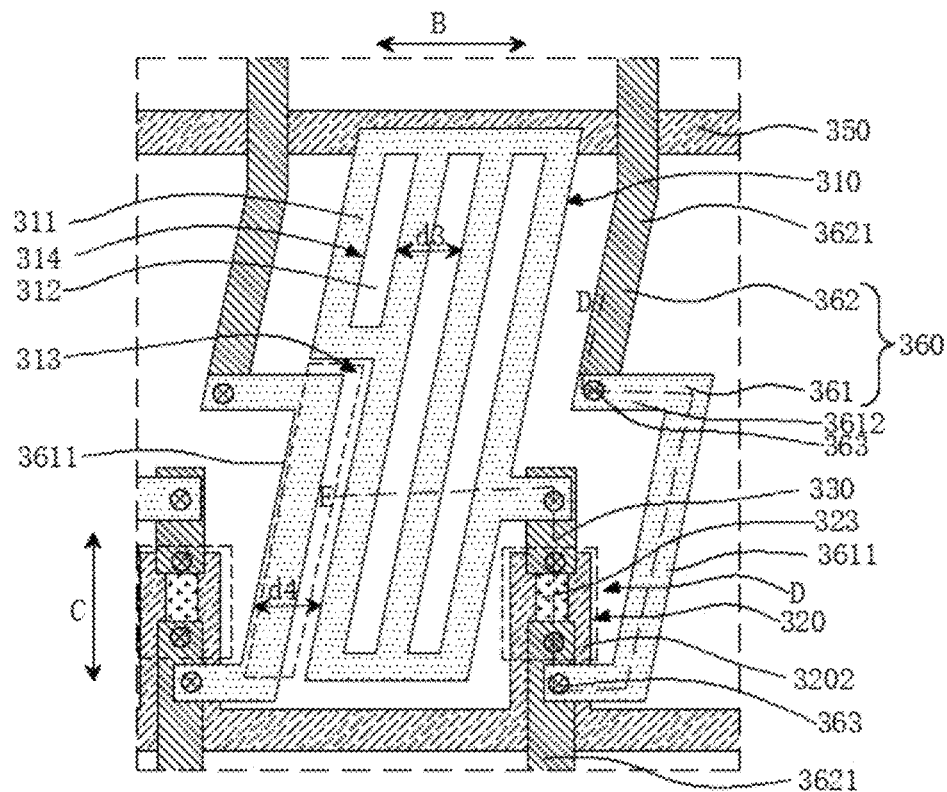
FIG. 3 is a schematic top-view structural diagram of an array substrate according to some embodiments of the present disclosure.
Figure 4:
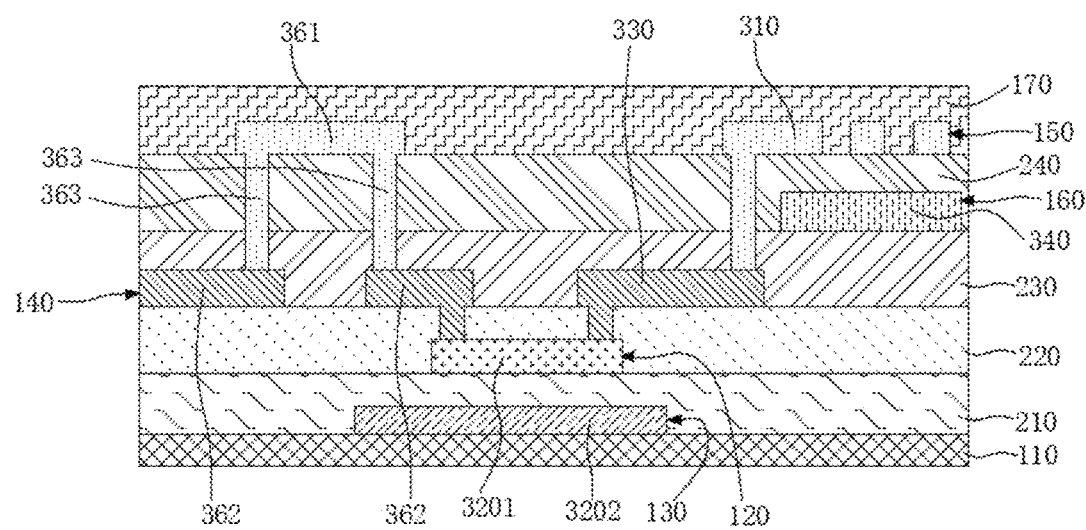
FIG. 4 is a schematic view of a cross-sectional structure of the array substrate at the position of DE shown in FIG. 3.

Optionally, in some embodiment, referring to FIG. 3 and FIG. 4, the pixel electrode 310 includes multiple strip sub-electrodes 311 arranged in parallel; the first conductive lead 361 arranged adjacent to the pixel electrode 310 includes a first strip lead segment 3611, and the extending direction of the first strip lead segment 3611 is parallel to the extending direction of the strip sub-electrode 311 of the adjacent pixel electrode 310. In this way, by adjusting the distance between the first strip lead segment 3611 and the adjacent pixel electrode 310, in the display stage of the display panel, the first strip lead segment 3611 may be equivalent to another common electrode. An electric field may be formed between the pixel electrode 310 and its adjacent first strip lead segment 3611, and the intensity and distribution of the electric field are related to the electromotive force of the pixel electrode 310, so that the light transmittance of the region between the pixel electrode 310 and its adjacent first strip lead segment 3611 is related to the light transmittance of the sub-pixel. Therefore, the light transmittance of the region between the first strip lead segment 3611 and its adjacent pixel electrode 310 may be changed correspondingly with the change of the light transmittance of the adjacent sub-pixel, thereby improving the total amount of transmitted light of the adjacent sub-pixel, so as to improve the display brightness of the display panel. In addition, different first strip lead segments 3611 located on the same data line 360 can cooperate with their respective adjacent pixel electrodes 310 to change the electric field distribution around them independently, so that the first strip lead segment 3611 can be used to enhance the light output intensity of the sub-pixel, and avoid obvious color shift in the image displayed by the display panel.

Further optionally, in some embodiments, referring to FIG. 3 and FIG. 4, the pixel electrode 310 includes hollow slits 312 and strip sub-electrodes 311 arranged alternately. Along the extending direction of the scan line 350, a total size of one hollow slit 312 and one adjacent strip sub-electrode 311 is a third dimension d3. Along the extending direction of the scan line 350, a distance between an edge of the first strip lead segment 3611 away from its adjacent pixel electrode 310 and an edge of the pixel electrode 310 close to the first strip lead segment 3611 is a fourth dimension d4. The fourth dimension d4 is equal to 0.5 to 3 times the third dimension d3. Preferably, the fourth dimension d4 is equal to 0.8-1.2 times the third dimension d3.

Further optionally, in some embodiments, the third dimension d3 is 6-10 micrometers, and the fourth dimension d4 is 6-10 micrometers.

Further optionally, in some embodiments, the distance between the first strip lead segment 3611 and its adjacent pixel electrode 310 is equal to 0.5-3 times the width of the hollow slit 312 of the pixel electrode 310. Preferably, the distance between the first strip lead segment 3611 and its adjacent pixel electrode 310 is equal to 0.8-1.2 times the width of the hollow slit 312 of the pixel electrode 310.

Figure 5:
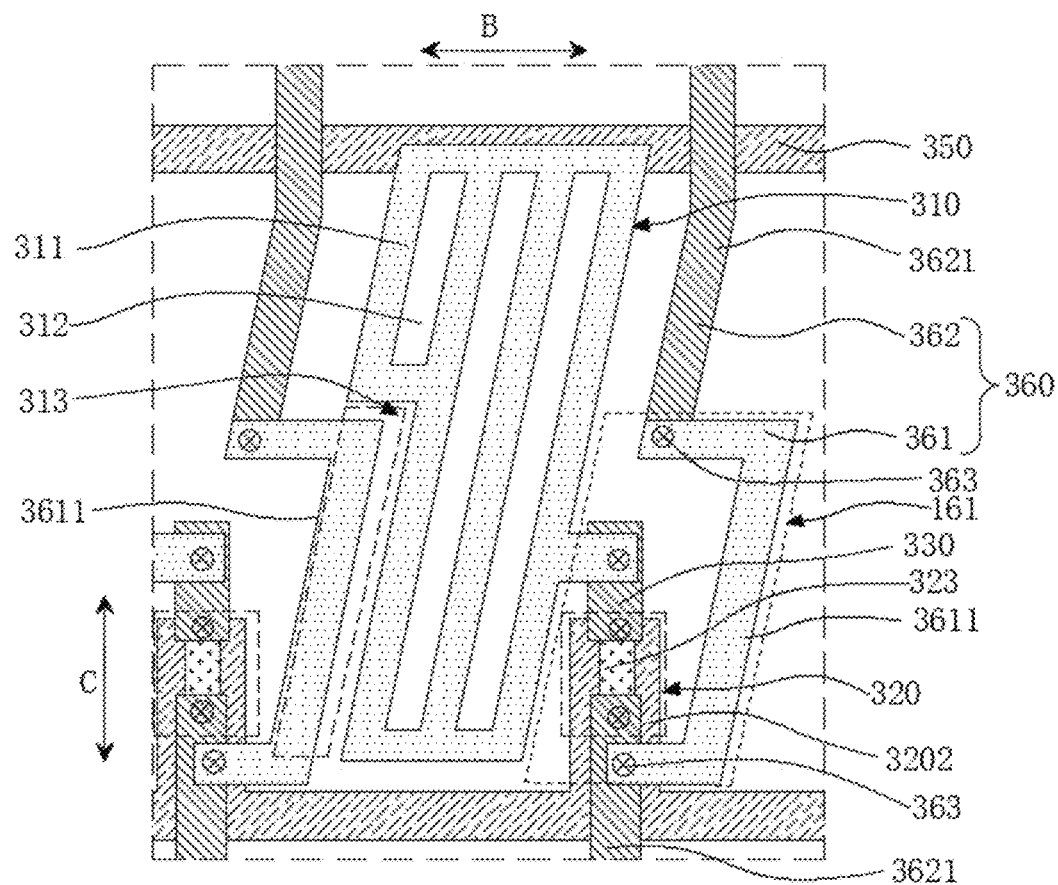
FIG. 5 is a schematic top-view structural diagram of an array substrate according to some embodiments of the present disclosure.

Optionally, in some embodiments, referring to FIG. 4 and FIG. 5 (the common electrode 340 is not shown in FIG. 5), the sub-pixel further includes a common electrode, and an avoidance opening 161 (dotted line in FIG. 5) is provided between the common electrodes of two adjacent sub-pixels along the row direction B. The orthographic projection of the first conductive lead 361 on the base substrate 110 is located within the orthographic projection of the avoidance opening 161 on the base substrate 110. In this way, the coupling effect of the common electrode 340 on the first conductive lead 361 can be weakened, so that when the display panel is in the scanning stage, the light leakage caused by the first conductive lead 361 that is not related to the transmittance of the adjacent sub-pixel is reduced, thereby improving the display accuracy of image on the display panel and improving the display quality.

Exemplarily, the pixel electrode 310 in the sub-pixel includes multiple strip sub-electrodes 311 arranged in parallel. The first conductive lead 361 is a bend line, including the connecting lead segment and the first strip lead segment 3611 connected in sequence. The connecting lead segment is connected to the second conductive lead 362 and parallel to the scan line 350. The first strip lead segment 3611 extends in the same direction as the strip sub-electrode 311 of the pixel electrode and is electrically connected to the second conductive lead 362 in the next row. The pixel electrode 310 is provided with a protruding portion 314, and the protruding portion 314 of the pixel electrode 310 is located on the extension line of the first strip lead segment 3611 arranged adjacent to the pixel electrode 310. The extending direction of the first strip lead segment 3611 is parallel to the extending direction of the strip sub-electrode 311 of the adjacent pixel electrode 310. The first conductive lead 361 and the pixel electrode 310 are arranged in the same layer and made of the same material.

Figure 6:
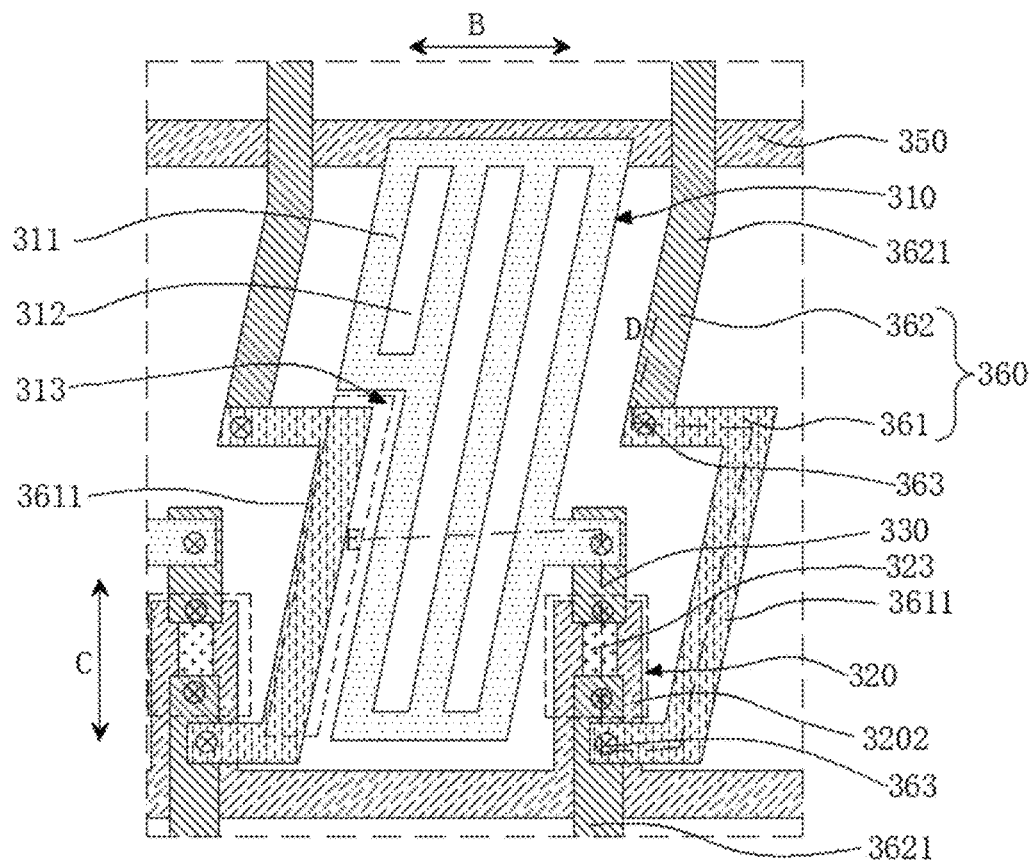
FIG. 6 is a schematic top-view structural diagram of an array substrate according to some embodiments of the present disclosure.
Figure 7:
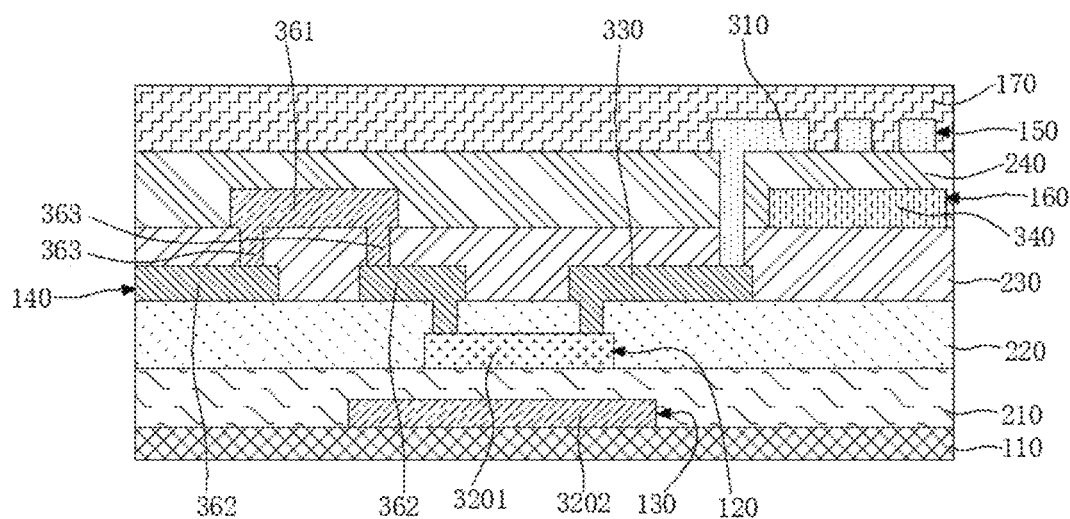
FIG. 7 is a schematic view of a cross-sectional structure of the array substrate at the position of DE shown in FIG. 6.

In some other embodiments of the present disclosure, referring to FIG. 6 and FIG. 7, the sub-pixel further includes a common electrode 340. The data line 360 includes the first conductive lead 361 and the second conductive lead 362 that are alternately connected. The first conductive lead 361 and the common electrode 340 are provided in the same layer and made of the same material. The second conductive lead 362 and the drain electrode 330 of the switch transistor are provided in the same layer and made of the same material. In other words, the sub-pixel further includes the common electrode 340; the array substrate includes the source-drain metal layer 140 and the common electrode layer 160 sequentially stacked on one side of the base substrate 110, where the source-drain metal layer 140 includes the drain electrode 330 and the second conductive lead 362; the common electrode layer 160 includes the common electrode 340 and the first conductive lead 361; and the first conductive lead 361 and the second conductive lead 362 are electrically connected through the via hole 363.

Figure 8:
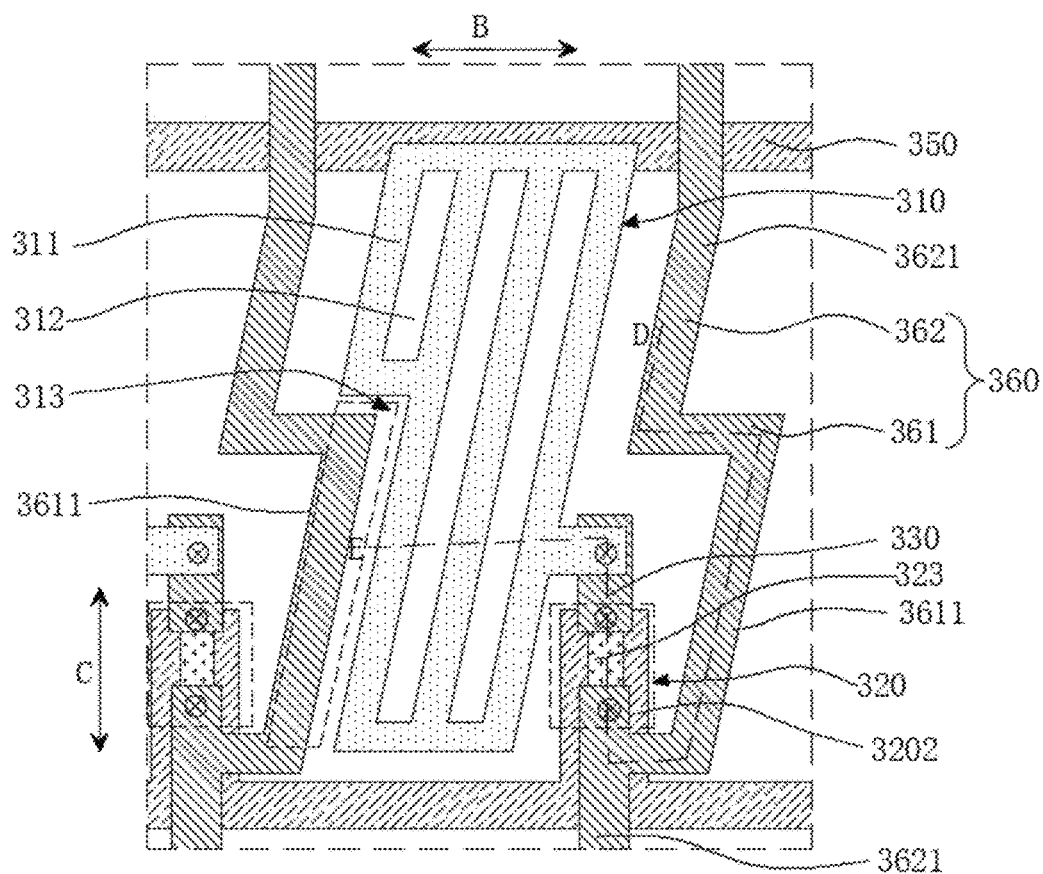
FIG. 8 is a schematic top-view structural diagram of an array substrate according to some embodiments of the present disclosure.
Figure 9:
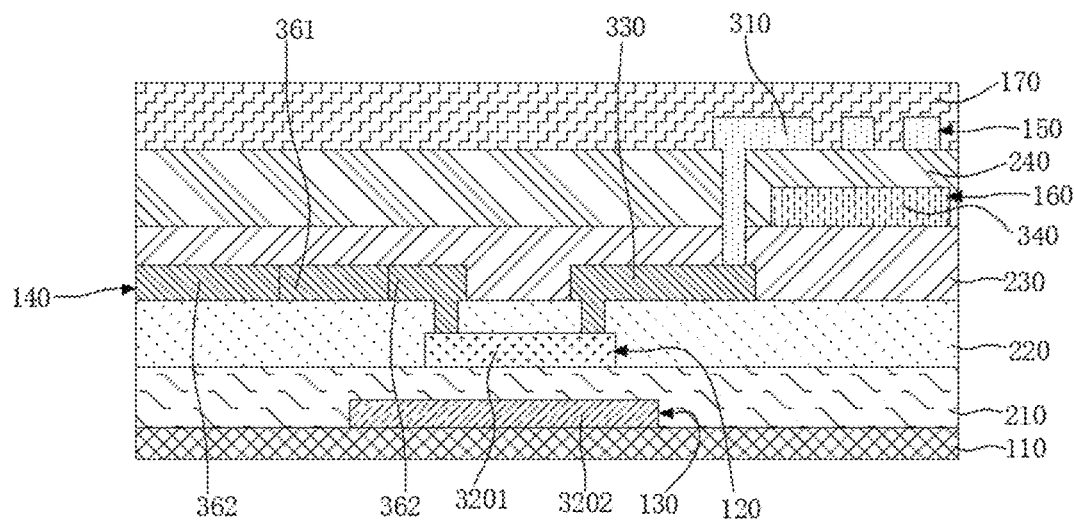
FIG. 9 is a schematic view of a cross-sectional structure of the array substrate at the position of DE shown in FIG. 8.

In some other embodiments of the present disclosure, referring to FIG. 8 and FIG. 9, the data line 360 and the drain electrode 330 of the switch transistor are provided in the same layer and made of the same material. In other words, the array substrate includes the source-drain metal layer 140 disposed on one side of the base substrate 110, and the source-drain metal layer 140 includes the drain electrode 330, and the first conductive lead 361 and the second conductive lead 362 connected to each other.

Figure 10:
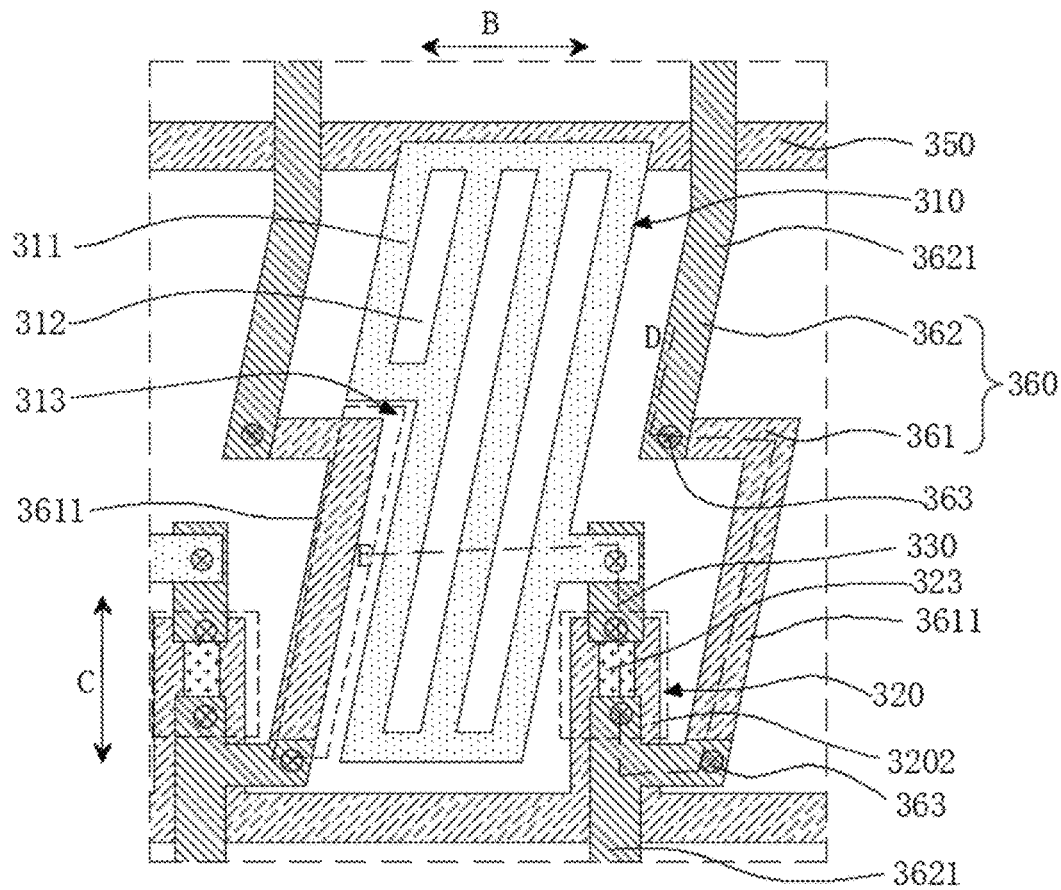
FIG. 10 is a schematic top-view structural diagram of an array substrate according to some embodiments of the present disclosure.
Figure 11:
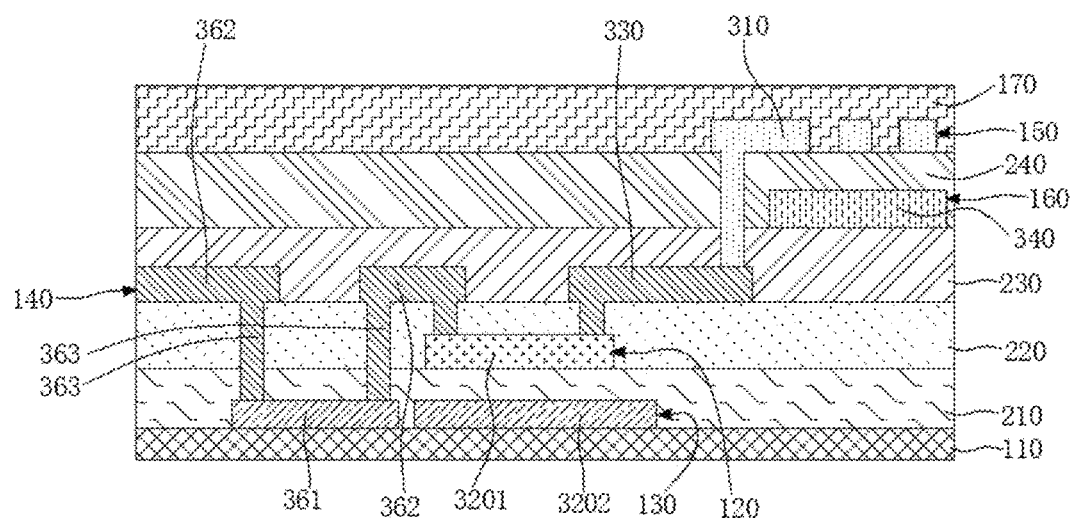
FIG. 11 is a schematic view of a cross-sectional structure of the array substrate at the position of DE shown in FIG. 10.

In some other embodiments of the present disclosure, referring to FIG. 10 and FIG. 11, the data line 360 includes the first conductive lead 361 and the second conductive lead 362 that are alternately connected; the first conductive lead 361 and the scan line 350 are provided in the same layer and made of the same material; the second conductive lead 362 and the drain electrode 330 of the switch transistor are provided in the same layer and made of the same material; and the first conductive lead 361 and the second conductive lead 362 are electrically connected through the via hole 363. In other words, the array substrate includes the gate layer 130 and the source-drain metal layer 140 sequentially stacked on one side of the base substrate 110, where the gate layer 130 includes the scan line 350, the gate electrode 3202 of the switch transistor, and the first conductive lead 361; the source-drain metal layer 140 includes the drain electrode 330 and the second conductive lead 362; and the first conductive lead 361 and the second conductive lead 362 are electrically connected through the via hole 363.

Figure 12:
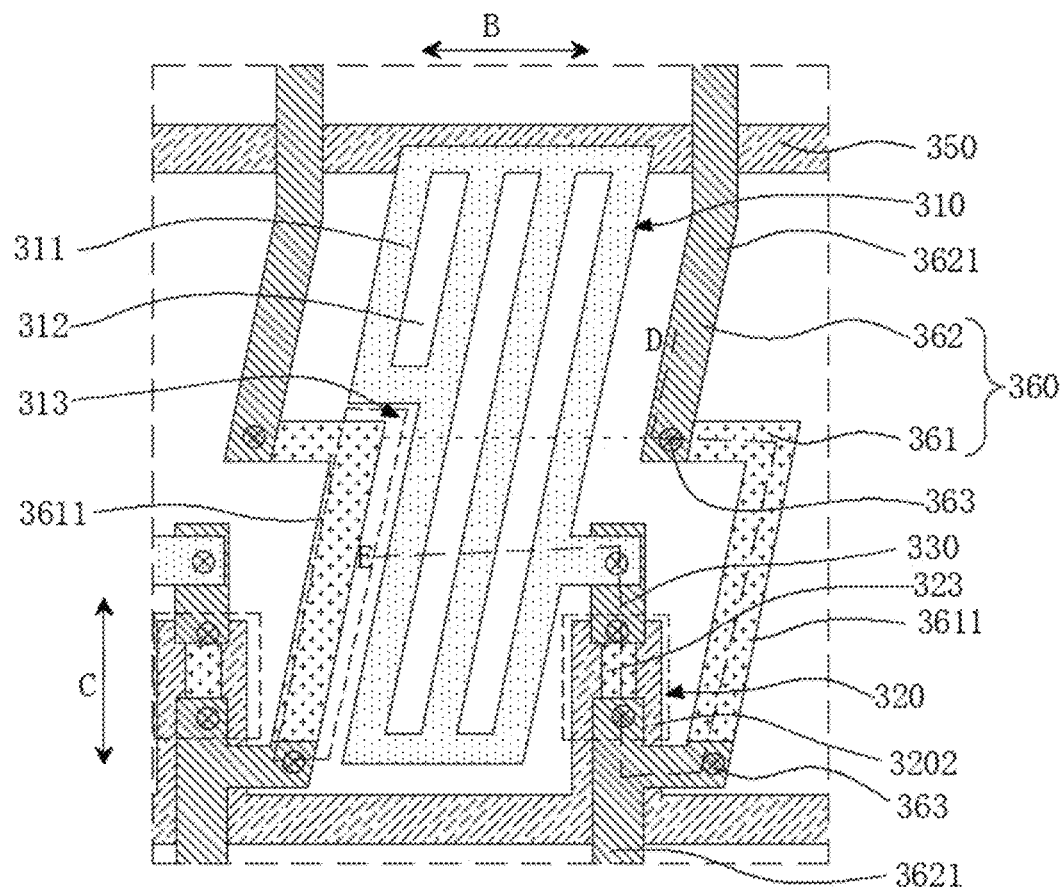
FIG. 12 is a schematic top-view structural diagram of an array substrate according to some embodiments of the present disclosure.
Figure 13:
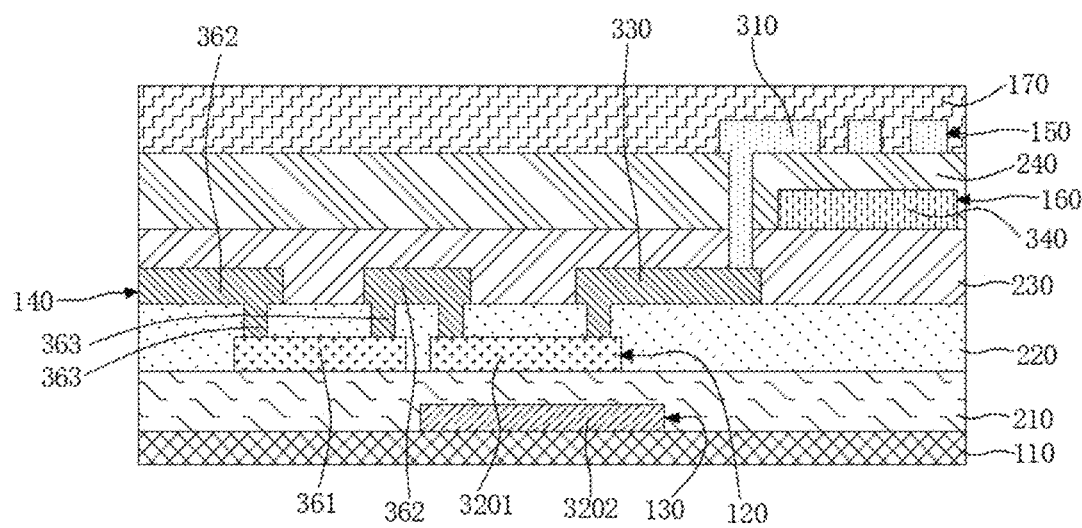
FIG. 13 is a schematic view of a cross-sectional structure of the array substrate at the position of DE shown in FIG. 12.

In some other embodiments of the present disclosure, referring to FIG. 12 and FIG. 13, the data line 360 includes the first conductive lead 361 and the second conductive lead 362 that are alternately connected; the first conductive lead 361 and the active layer 3201 of the switch transistor are provided in the same layer; the second conductive lead 362 and the drain electrode 330 of the switch transistor are provided in the same layer and made of the same material; and the first conductive lead 361 and the second conductive lead 362 are electrically connected through the via hole 363. In other words, the array substrate includes the semiconductor layer 120 and the source-drain metal layer 140 sequentially stacked on one side of the base substrate 110, where the semiconductor layer 120 includes the active layer 3201 of the switch transistor and the first conductive lead 361; the source-drain metal layer 140 includes the drain electrode 330 and the second conductive lead 362; and the first conductive lead 361 and the second conductive lead 362 are electrically connected through the via hole 363.

Optionally, in some embodiments, the material of the first conductive lead 361 may be a semiconductor material modified by doping, so that the first conductive lead 361 has good conductivity. Exemplarily, referring to FIG. 15, the active layer 3201 of the switch transistor includes the channel region 323 and a source contact region 321 and a drain contact region 322 on both sides of the channel region 323, where the material of the channel region 323 is a low temperature polysilicon semiconductor material, and the material of the source contact region 321 and the drain contact region 322 is doped low temperature polysilicon. The material of the first conductive lead 361 is doped low temperature polysilicon.

Figure 15:
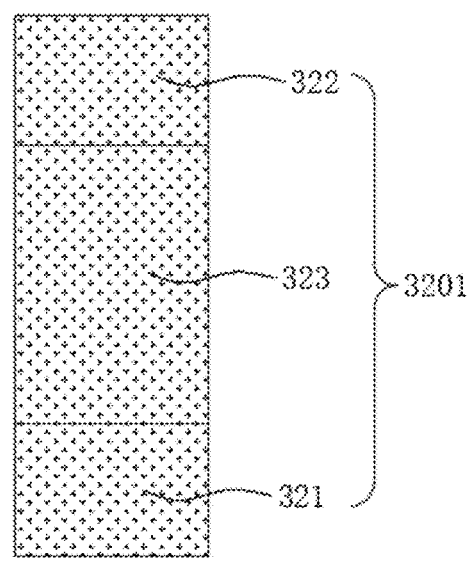
FIG. 15 is a schematic top-view structural diagram of an active layer of a switch transistor according to some embodiments of the present disclosure.

Optionally, referring to FIG. 15, the active layer 3201 of the switch transistor includes the source contact region 321, the channel region 323 and the drain contact region 322 which are sequentially arranged along a straight line. In this way, the active layer 3201 of the switch transistor is arranged in a straight line, thereby further reducing the area occupied by the switch transistor 320, and increasing the area of the pixel electrode 310. The channel direction of the active layer 3201 is the extending direction of the channel region 323 of the active layer 3201, that is, a direction connecting the source contact region 321 and the drain contact region 322 of the active layer 3201.

In some embodiments, the channel direction of the active layer 3201 is consistent with the extending direction of the scan line 350.

In some other embodiments, a preset included angle is formed between the channel direction of the active layer 3201 and the extending direction of the scan line 350.

In some embodiments of the present disclosure, the source contact region 321 is located on one side of the channel region 323 close to the scan line 350 connected to the switch transistor 320, and the drain contact region 322 is located on one side of the channel region 323 away from the scan line 350 connected to the switch transistor 320.

Optionally, the distance between the orthographic projection of the pixel electrode 310 on the base substrate 110 and the orthographic projection of the scan line 350 connected thereto on the base substrate 110 is the first dimension; the width of the channel region 323 of the switch transistor is the second dimension; and the first dimension is not larger than the second dimension. The width of the channel region 323 of the switch transistor refers to a dimension of the channel region 323 of the switch transistor in a plane parallel to the plane of the base substrate 110 and along a direction perpendicular to a connecting line between the source contact region 321 and the drain contact region 322 of the switch transistor. In this way, the pixel electrode 310 of the sub-pixel may be as close as possible to the scan line 350 connected to the sub-pixel, occupying the avoidance space A in the related art as much as possible, thereby increasing the area of the pixel electrode 310.

Optionally, referring to FIG. 3, FIG. 5, FIG. 6, FIG. 8, FIG. 10, FIG. 12, and FIG. 14, in the array substrate according to some embodiments of the present disclosure, the orthographic projection of the switch transistor 320 of the sub-pixel on the base substrate 110 is located between the orthographic projection of the pixel electrode 310 of the sub-pixel on the base substrate 110 and the orthographic projection of the data line 360 electrically connected to the sub-pixel on the base substrate 110. In this way, when viewed from the direction perpendicular to the normal line of the base substrate 110, the switch transistor 320 of the sub-pixel can be prevented from being disposed between the pixel electrode 310 of the sub-pixel and the scan line 350, thereby preventing a space for avoiding the switch transistor 320 from being formed between the pixel electrode 310 and the scan line 350, so as to further increase the area of the pixel electrode 310.

In some embodiments of the present disclosure, referring to FIG. 3, FIG. 5, FIG. 6, FIG. 8, FIG. 10, and FIG. 12, the channel direction of the active layer 3201 is perpendicular to the extending direction of the scan line 350. In other words, the extending direction of the connection line between the source contact region 321 and the drain contact region 322 of the switch transistor is perpendicular to the extending direction of the scan line 350. In this way, the size of the switch transistor 320 in the extending direction of the scan line 350 can be reduced, thereby reducing the avoidance notch 313 of the pixel electrode 310, so that the pixel electrode 310 can be more regular as a whole. In addition, it is also beneficial to arrange the gate electrode 3202 of the switch transistor at a right angle with the scan line 350, thereby facilitating the preparation of the gate electrode 3202 of the switch transistor, and improving the pattern accuracy of the gate electrode 3202 of the switch transistor.

Figure 14:
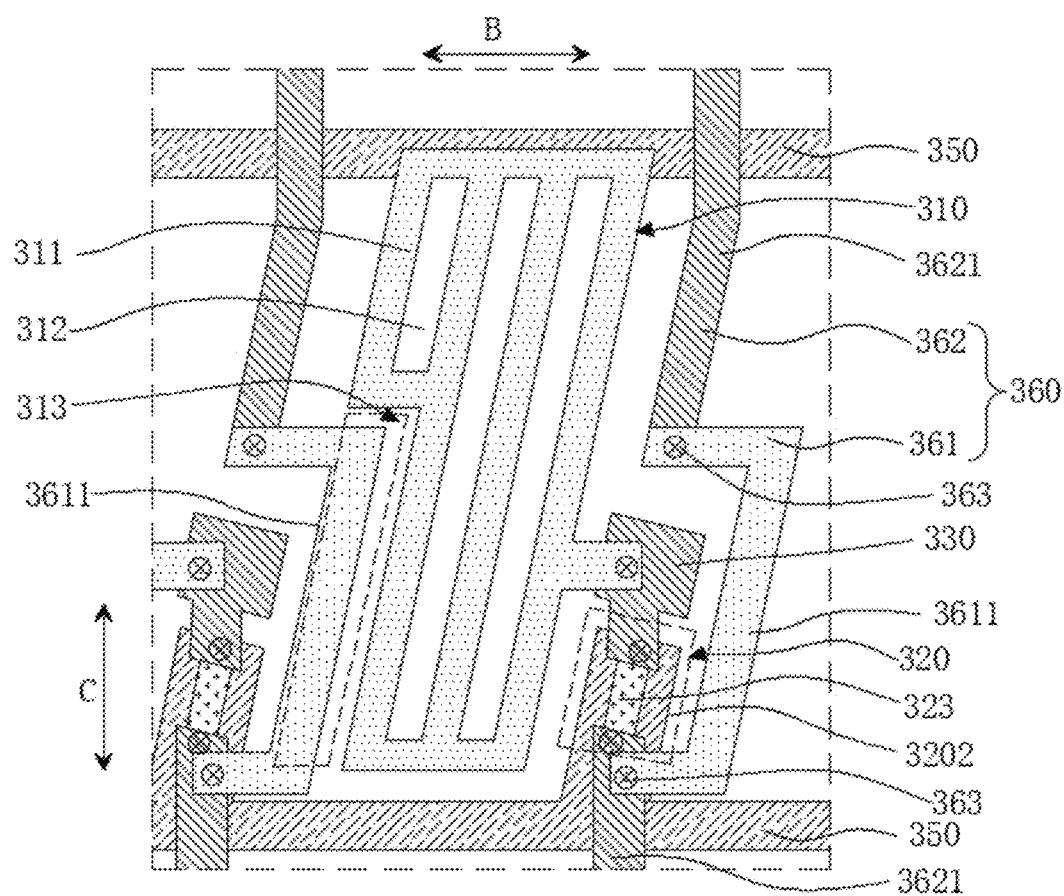
FIG. 14 is a schematic top-view structural diagram of an array substrate according to some embodiments of the present disclosure.

In some other embodiments of the present disclosure, referring to FIG. 14, the pixel electrode 310 includes multiple strip sub-electrodes 311 arranged in parallel, and the included angle between the strip sub-electrodes 311 and the scan line 350 is not 90 degrees. In the same sub-pixel, the channel direction of the active layer 3201 is consistent with the extending direction of the strip sub-electrodes 311 of the pixel electrode. The pixel electrode 310 includes multiple strip sub-electrodes 311 arranged in parallel; and in the same sub-pixel, the extending direction of the connection line between the source contact region 321 and the drain contact region 322 of the switch transistor is parallel to the extending direction of the strip sub-electrode 311. In this way, the extending direction of the switch transistor 320 is substantially consistent with the edge of the pixel electrode 310, so as to more effectively reduce the space occupied by the switch transistor 320, thereby increasing the area of the pixel electrode 310.

Optionally, referring to FIG. 4, FIG. 9, FIG. 11 and FIG. 13, the array substrate is further provided with an alignment layer 170 on one side of the pixel electrode 310 away from the base substrate 110.

Embodiments of the present disclosure further provide a display apparatus, which includes an array substrate according to any one of the foregoing array substrate embodiments. The display apparatus may be a mobile phone screen, a watch screen, a display or other types of display apparatus. Since the display apparatus includes the array substrate according to any one of the foregoing array substrate embodiments, the same beneficial effects can be achieved, and details are not described herein.

Figure 16:
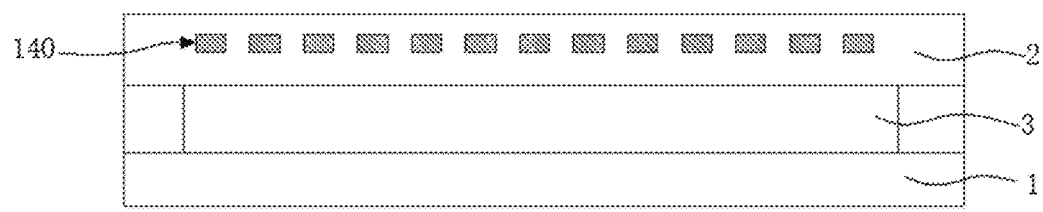
FIG. 16 is a schematic cross-sectional structural diagram of a display apparatus according to some embodiments of the present disclosure.

Optionally, referring to FIG. 16, the display apparatus includes a color filter substrate 2 and an array substrate 1 according to any one of the foregoing array substrate embodiments that are arranged to form a cell, and further includes a liquid crystal layer 3 provided between the color filter substrate 2 and the array substrate 1. Further, the display apparatus further includes a backlight module located on one side of the array substrate 1 away from the color filter substrate 2.

In some embodiments of the present disclosure, the color filter substrate 2 includes a black matrix layer 21, and the orthographic projection of the black matrix layer 21 on the base substrate 110 covers the orthographic projection of the switch transistor 320 and the data line 360 on the base substrate 110. In this way, light transmission at the positions of the switch transistor 320 and the data line 360 can be prevented from affecting the display effect.

In some other embodiments of the present disclosure, referring to FIG. 3 and FIG. 4, the array substrate 1 includes the source-drain metal layer 140 and the pixel electrode layer 150 sequentially stacked on one side of the base substrate 110, where the source-drain metal layer 140 includes the second conductive lead 362 and the drain electrode 330, the pixel electrode layer 150 includes the pixel electrode 310 and the first conductive lead 361, and the first conductive lead 361 and the second conductive lead 362 are electrically connected through the via hole 363. The pixel electrode 310 includes multiple strip sub-electrodes 311 arranged in parallel; the first conductive lead 361 arranged adjacent to the pixel electrode 310 includes a first strip lead segment 3611, and the extending direction of the first strip lead segment 3611 is parallel to the extending direction of the strip sub-electrode 311 of the adjacent pixel electrode 310.

Referring to FIG. 16, the color filter substrate 2 includes the black matrix layer 21, and the orthographic projection of the black matrix layer 21 on the base substrate 110 does not overlap with the orthographic projection of the first strip lead segment 3611 on the base substrate 110. In this way, the black matrix does not block the position of the first strip lead segment 3611, so that the light transmitted through the first strip lead segment 3611 can be emitted outside the display panel, thereby improving the display brightness of the display panel.

It should be understood that the present disclosure does not limit its application to the detailed structure and arrangement of components set forth in this disclosure. The present disclosure can be implemented in other embodiments and can be embodied and carried out in various ways. Variations and modifications of the foregoing embodiments fall within the scope of the present disclosure. It should be understood that the disclosure disclosed and defined in this disclosure extends to all alternative combinations of two or more of the individual features mentioned or evident in the text and/or drawings. All of these different combinations constitute various alternative aspects of the present disclosure. The embodiments of this disclosure illustrate the best mode known for carrying out the disclosure, and will enable any person skilled in the art to utilize the disclosure.

What is claimed is:

1. An array substrate, comprising sub-pixels arranged in an array, scan lines, and data lines on a base substrate, with any one of the sub-pixels comprising a pixel electrode and a switch transistor; wherein the pixel electrode is connected to a drain electrode of the switch transistor, a gate electrode of the switch transistor is connected to one of the scan lines, and a source electrode of the switch transistor is connected to one of the data lines; and
- an active layer of the switch transistor of the sub-pixel is located between the pixel electrode of the sub-pixel and the data line connected to the sub-pixel,
- wherein a first distance between the pixel electrode and the data line connected to the sub-pixel is greater than a second distance between the pixel electrode and the scan line connected to the switch transistor, and the active layer is formed within a range of the first distance,
- wherein the data line comprises first conductive leads and second conductive leads that are alternatively connected;
- the second conductive lead extends along a direction intersecting the scan line, and the first conductive lead is bent into a curve or a bend line from an extending direction of the second conductive lead adjacent to the first conductive lead to a direction away from the pixel electrode of the sub-pixel connected to the data line;
- a first end of the first conductive lead is connected to a first end of the second conductive lead, and a second end of the first conductive lead is connected to a second end of a second conductive lead in a next row; an avoidance area is formed between the first conductive lead and the pixel electrode of the sub-pixel adjacent to and electrically connected to the first conductive lead, and an extension line of the second end of the second conductive lead and the active layer are located in the avoidance area.

2. The array substrate according to claim 1, wherein a preset included angle is formed between a channel direction of the active layer and an extending direction of the scan line.

3. The array substrate according to claim 2, wherein the channel direction of the active layer is perpendicular to the extending direction of the scan line.

4. The array substrate according to claim 2, wherein the pixel electrode in the sub-pixel comprises strip sub-electrodes, and an included angle between the strip sub-electrode and the scan line is not 90 degrees; and in a same sub-pixel, the channel direction of the active layer is consistent with an extending direction of the strip sub-electrode of the pixel electrode.

5. The array substrate according to claim 1, wherein a channel direction of the active layer is consistent with an extending direction of the scan line.

6. The array substrate according to claim 1, wherein the second conductive lead is a metal lead; and the first conductive lead is a metal lead or a transparent metal oxide lead.

7. The array substrate according to claim 1, wherein the second conductive lead and the drain electrode of the switch transistor are provided in a same layer and made of a same material; and the first conductive lead and one of the pixel electrode, a common electrode of the array substrate, a common electrode line of the array substrate, the drain electrode of the switch transistor, and the scan line are arranged in a same layer and made of a same material.

8. The array substrate according to claim 1, wherein the pixel electrode in the sub-pixel comprises strip sub-electrodes arranged in parallel; the first conductive lead is formed in a bend line, and comprises a connecting lead segment and a first strip lead segment connected in sequence; the connecting lead segment is connected to the second conductive lead and is parallel to the scan line, and the first strip lead segment extends along a same direction as the strip sub-electrode of the pixel electrode and is electrically connected to the second conductive lead in the next row.

9. The array substrate according to claim 8, wherein the pixel electrode is provided with a protruding portion, and the protruding portion of the pixel electrode is located on an extension line of the first strip lead segment arranged adjacent to the pixel electrode;
- an extending direction of the first strip lead segment is parallel to an extending direction of the strip sub-electrode of the pixel electrode arranged adjacent to the first strip lead segment; and the first conductive lead and the pixel electrode are arranged in a same layer and made of a same material.

10. The array substrate according to claim 1, wherein the pixel electrode in the sub-pixel comprises strip sub-electrodes; the second conductive lead comprises a second strip lead segment, and an extending direction of the second strip lead segment is parallel to an extending direction of the strip sub-electrode of the pixel electrode arranged adjacent to the second strip lead segment.

11. A display apparatus comprising an array substrate, wherein the array substrate comprises sub-pixels arranged in an array, scan lines, and data lines on a base substrate, with any one of the sub-pixels comprising a pixel electrode and a switch transistor; wherein the pixel electrode is connected to a drain electrode of the switch transistor, a gate electrode of the switch transistor is connected to one of the scan lines, and a source electrode of the switch transistor is connected to one of the data lines; and
- an active layer of the switch transistor of the sub-pixel is located between the pixel electrode of the sub-pixel and the data line connected to the sub-pixel,
- wherein a first distance between the pixel electrode and the data line connected to the sub-pixel is greater than a second distance between the pixel electrode and the scan line connected to the switch transistor, and the active layer is formed within a range of the first distance,
- wherein the data line comprises first conductive leads and second conductive leads that are alternatively connected;
- the second conductive lead extends along a direction intersecting the scan line, and the first conductive lead is bent into a curve or a bend line from an extending direction of the second conductive lead adjacent to the first conductive lead to a direction away from the pixel electrode of the sub-pixel connected to the data line;

a first end of the first conductive lead is connected to a first end of the second conductive lead, and a second end of the first conductive lead is connected to a second end of a second conductive lead in a next row; an avoidance area is formed between the first conductive lead and the pixel electrode of the sub-pixel adjacent to and electrically connected to the first conductive lead, and an extension line of the second end of the second conductive lead and the active layer are located in the avoidance area.

12. The display apparatus according to claim 11, wherein a preset included angle is formed between a channel direction of the active layer and an extending direction of the scan line.

13. The display apparatus according to claim 12, wherein the channel direction of the active layer is perpendicular to the extending direction of the scan line.

14. The display apparatus according to claim 12, wherein the pixel electrode in the sub-pixel comprises strip sub-electrodes, and an included angle between the strip sub-electrode and the scan line is not 90 degrees; and in a same sub-pixel, the channel direction of the active layer is consistent with an extending direction of the strip sub-electrode of the pixel electrode.

15. The display apparatus according to claim 11, wherein a channel direction of the active layer is consistent with an extending direction of the scan line.

16. The display apparatus according to claim 13, wherein the second conductive lead is a metal lead; and the first conductive lead is a metal lead or a transparent metal oxide lead.

17. The display apparatus according to claim 11, wherein the second conductive lead and the drain electrode of the switch transistor are provided in a same layer and made of a same material; and the first conductive lead and one of the pixel electrode, a common electrode of the array substrate, a common electrode line of the array substrate, the drain electrode of the switch transistor, and the scan line are arranged in a same layer and made of a same material.

18. The display apparatus according to claim 11, wherein the pixel electrode in the sub-pixel comprises strip sub-electrodes arranged in parallel; the first conductive lead is formed in a bend line, and comprises a connecting lead segment and a first strip lead segment connected in sequence; the connecting lead segment is connected to the second conductive lead and is parallel to the scan line, and the first strip lead segment extends along a same direction as the strip sub-electrode of the pixel electrode and is electrically connected to the second conductive lead in the next row.

* * * * *